United States Patent
Morrow et al.

(10) Patent No.: US 6,625,023 B1
(45) Date of Patent: Sep. 23, 2003

(54) MODULAR SPRAY COOLING SYSTEM FOR ELECTRONIC COMPONENTS

(75) Inventors: Ernest J. Morrow, Monticello, FL (US); Sally M. Sellers, Tallahassee, FL (US); Gary D. Knudsen, Tallahasse, FL (US)

(73) Assignee: General Dynamics Land Systems, Inc., Sterling Heights, MI (US)

( * ) Notice: Subject to any disclaimer, the term of this patent is extended or adjusted under 35 U.S.C. 154(b) by 0 days.

(21) Appl. No.: 10/120,993

(22) Filed: Apr. 11, 2002

(51) Int. Cl.[7] ................................................. H05K 7/20
(52) U.S. Cl. ................. 361/700; 62/259.2; 165/104.33; 165/908
(58) Field of Search ........................ 174/15.1; 62/259.2, 62/418; 361/689, 698, 699, 700, 717–720; 257/713–715; 165/80.3, 80.4, 908, 104.33

(56) References Cited

U.S. PATENT DOCUMENTS

| | | |
|---|---|---|
| 2,305,210 A | 12/1942 | Wahlin |
| 2,971,250 A | 2/1961 | Whalin |
| 3,054,563 A | 9/1962 | Steinen |
| 3,314,611 A | 4/1967 | McCartney et al. |
| 3,510,065 A | 5/1970 | Gigantino et al. |
| 3,843,055 A | 10/1974 | Nord et al. |
| 4,120,021 A | 10/1978 | Roush |
| 4,641,785 A | 2/1987 | Grothe |
| 4,646,977 A | 3/1987 | Iwamura et al. |
| 5,220,804 A | 6/1993 | Tilton et al. |
| 5,508,015 A | 4/1996 | Gonzalez et al. |
| 5,713,327 A | 2/1998 | Tilton et al. |
| 5,718,117 A | 2/1998 | McDunn et al. |
| 5,719,444 A | 2/1998 | Tilton et al. |
| 5,761,035 A | 6/1998 | Beise |
| 5,768,103 A | 6/1998 | Kobrinetz et al. |
| 5,831,824 A | 11/1998 | McDunn et al. |
| 5,860,602 A | 1/1999 | Tilton et al. |
| 5,880,931 A | 3/1999 | Tilton et al. |
| 5,907,473 A | 5/1999 | Przilas et al. |
| 5,933,700 A | 8/1999 | Tilton |
| 5,943,211 A | 8/1999 | Havey et al. |
| 5,999,404 A | 12/1999 | Hileman |
| 6,016,969 A | 1/2000 | Tilton et al. |
| 6,060,966 A | 5/2000 | Tennant et al. |
| 6,104,610 A | 8/2000 | Tilton et al. |
| 6,108,201 A | 8/2000 | Tilton et al. |
| 6,163,073 A | 12/2000 | Patel |
| 6,292,364 B1 * | 9/2001 | Fitzgerald et al. .......... 361/699 |

OTHER PUBLICATIONS

USPGPUB 2002/0112498 A1, Aug. 22, 2002, Bash.*
USPGPUB 2001/0002541 A1, Jun. 7, 2001, Patel.*

* cited by examiner

Primary Examiner—Gerald Tolin
(74) Attorney, Agent, or Firm—Brooks & Kushman P.C.

(57) ABSTRACT

A modular spray cooling system 10 for cooling electronic components in enclosures containing electronic components that dissipate heat and therefore require cooling. The modular system is mounted in a sealed enclosure 12 with an inside wall 14. A spray cooling module 26 is detachably mountable within the sealed enclosure 12. The coolant is distributed to a spray manifold card 48 that is provided with nozzles. Localized cooling is accomplished with the use of individual nozzles 17. The spray cooling module 26 atomizes the evaporative coolant through nozzles 22 so that liquid droplets of the coolant are delivered to the electronic components, and cooling of the components occurs upon evaporation. A method for cooling electronic components comprises the steps of: providing a sealed enclosure 12; priming the sealed enclosure 12 with an evaporative coolant that recirculates therewithin; detachably placing within the enclosure one or more sealed circuit card assemblies 24 containing the electronic components to be cooled; a spray cooling module 26 within the enclosure and delivering power to a pump within a spray cooling module 26 that is also detachably mountable within the sealed enclosure 12.

10 Claims, 3 Drawing Sheets

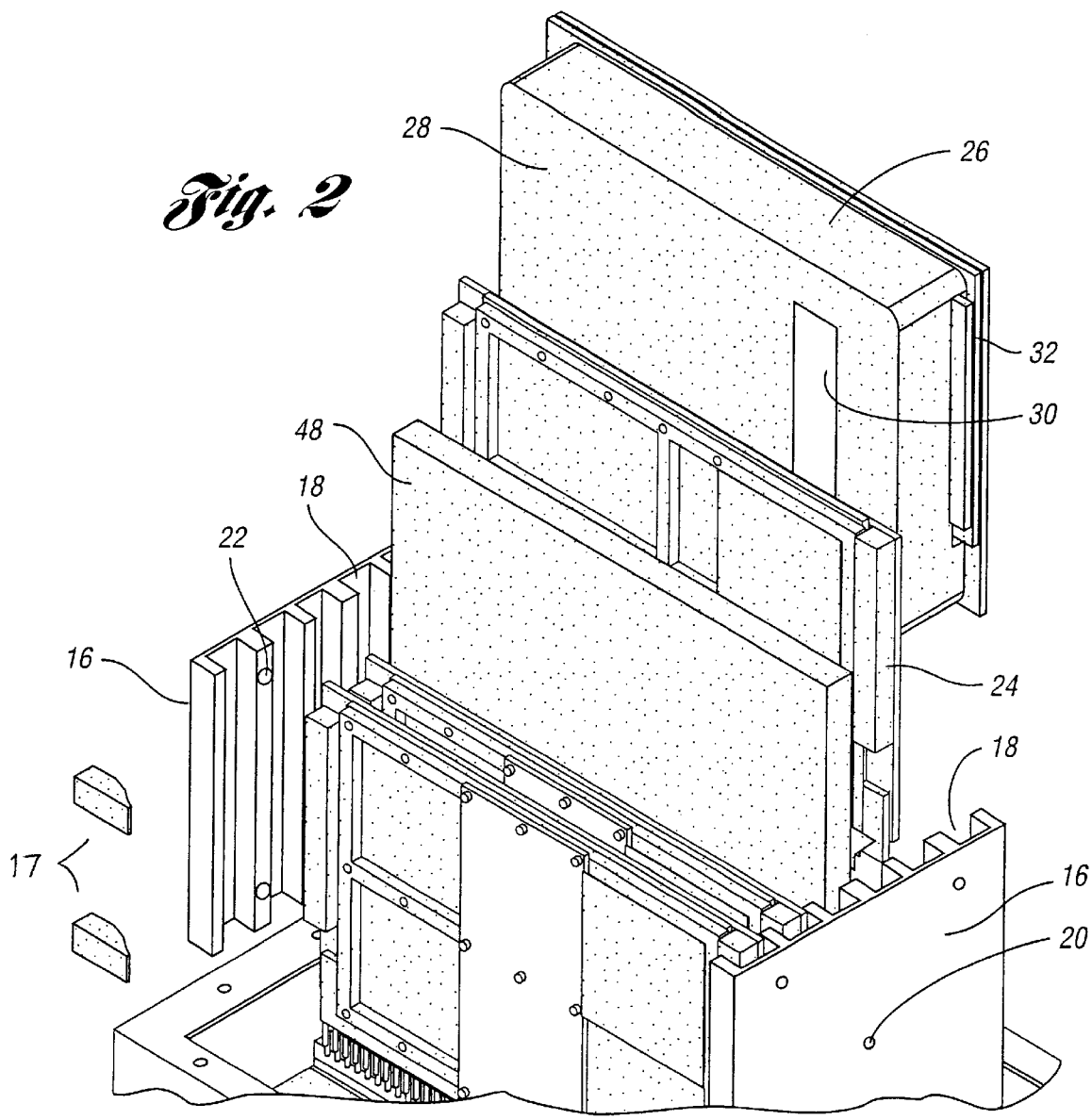
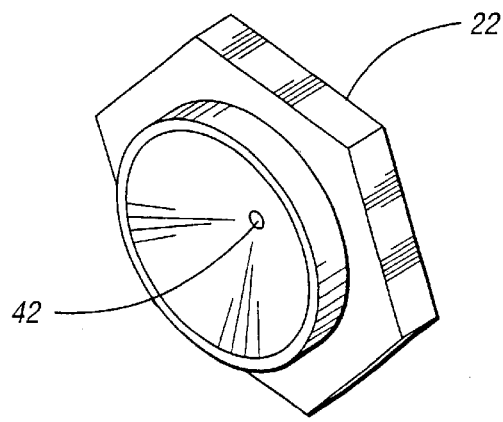

MODULAR SPRAY COOLING SYSTEM FOR ELECTRONIC COMPONENTS

BACKGROUND OF THE INVENTION

1. Field of the Invention

This invention relates to a modular spray cooling system and its method of use to cool components that are used in an electronic circuit which requires control of its operating temperature for effective functioning.

2. Background Art

Today, the quest continues for delivering higher electronic power in smaller packages. One aim of the engineer is to design systems, the temperatures of which can be maintained within acceptable limits when subjected to higher electrical load factors. Additionally, the packaging engineer contends with the problems of efficient use of space.

To use limited space efficiently, circuit card-guides conventionally are provided to support electronic components or printed circuit cards within an enclosure. The support arrangement provides stability and restraint under shock and vibration. Also, the arrangement often provides a heat path from a component to its housing. Typically, such arrangements locate electronic cards so that they lie parallel with each other, often with only a narrow space between adjacent cards. Each card may be electronically connected to a plate or backplane that lies perpendicular to the circuit cards. Because of the proximity of the cards within the enclosure and the electrical power generated, heating and consequent temperature rise often occurs if unchecked.

It is known that one way to remove such heat is to deploy fans which draw air over the heated component so that circulation removes heat primarily by convection. But spatial constraints often inhibit efficiency because air circulation is often insufficient to remove the heat generated. One adverse consequence is that the thermal tolerances of the electronic components may be exceeded.

U.S. Pat. No. 5,880,931 which issued on Mar. 9, 1999 discloses a spray-cooled circuit card cage which seals the enclosure and uses spray plates that release a mist of fine droplets of a coolant fluid. The '931 disclosure observes that considerable cost is involved in sealing the enclosure and supporting each circuit card adjacent to an associated spray plate. The system requires pressure to be applied from an exogenous source to a fluid entry port. Id., Col. 6, lines 47–48.

Also, illustrative of prior art approaches is an evaporative spray coolant for cooling a heat source, as described in U.S. Pat. No. 5,220,804, which issued on Jun. 22, 1993.

SUMMARY OF THE INVENTION

In light of problems that are unsolved by previous approaches, it would be desirable to provide a retrofittable cooling system for enclosures that contain electronic components or conductors. As a result, such a retrofittable cooling system may upgrade the enclosure so that it may contain components that dissipate heat at a higher rate. If so, redesign of the enclosure or housing can be avoided. Additionally, savings in space and weight can be realized and expenditures of time and money can be reduced.

The invention is a self-contained modular spray cooling system for cooling electronic components. The system has a sealed enclosure with an inside wall. Attached to the inside wall is a number of plates that include slots which enable sealed circuit card assemblies containing the electronic component to be detachably accommodated. A spray cooling module is removably mountable in a slot near one or more of the sealed circuit card assemblies within the sealed enclosure.

Additional features include a remotely located plate that can optionally be mounted in a card slot. The plate can optionally support individual spray nozzles and/or valves for recovering condensed fluid. In one embodiment, slotted plates on an inside wall may also contain coolant passages that provide a flow of an evaporative coolant.

The modular spray cooling system includes an evaporative coolant, distributed as fine droplets which are evaporated at least partially upon contact with the electronic components. Some of the coolant evaporates before condensation upon contact with a cooled inside wall of the sealed enclosure or with one of the plates. The condensate collects in a reservoir within the sealed enclosure. Coolant passages lead the condensed evaporative coolant from the reservoir to a pump for reuse within the sealed enclosure.

Thus, the system is basically self-contained. It requires no remotely-located plumbing or propellant. Its design allows for the ready removal and replacement of the electronic components that are cooled therewithin.

The invention also includes a method for cooling electronic components. It comprises the steps of:

providing a modular retrofit to an existing sealed enclosure having an inside wall;

locating a plurality of plates defining slots, the plurality of plates being attached to the inside wall, with the option of at least some of the plurality of plates having coolant passages;

priming the sealed enclosure with an evaporative coolant that may recirculate within the sealed enclosure through the coolant passages; and delivering power to a spray cooling module that is also detachably mountable within the sealed enclosure. The spray cooling module atomizes the liquid coolant through nozzles so that liquid droplets of the coolant are delivered to the electronic component, are vaporized, remove heat associated with the latent heat of vaporization, and thus cool the components.

BRIEF DESCRIPTION OF THE DRAWINGS

FIG. 2 is an enlargement of a portion thereof;

FIG. 4 is a quartering perspective view of one of a number of nozzles that are provided within a sealed housing of the present invention;

DETAILED DESCRIPTION OF THE PREFERRED EMBODIMENT(S)

Figure 1:
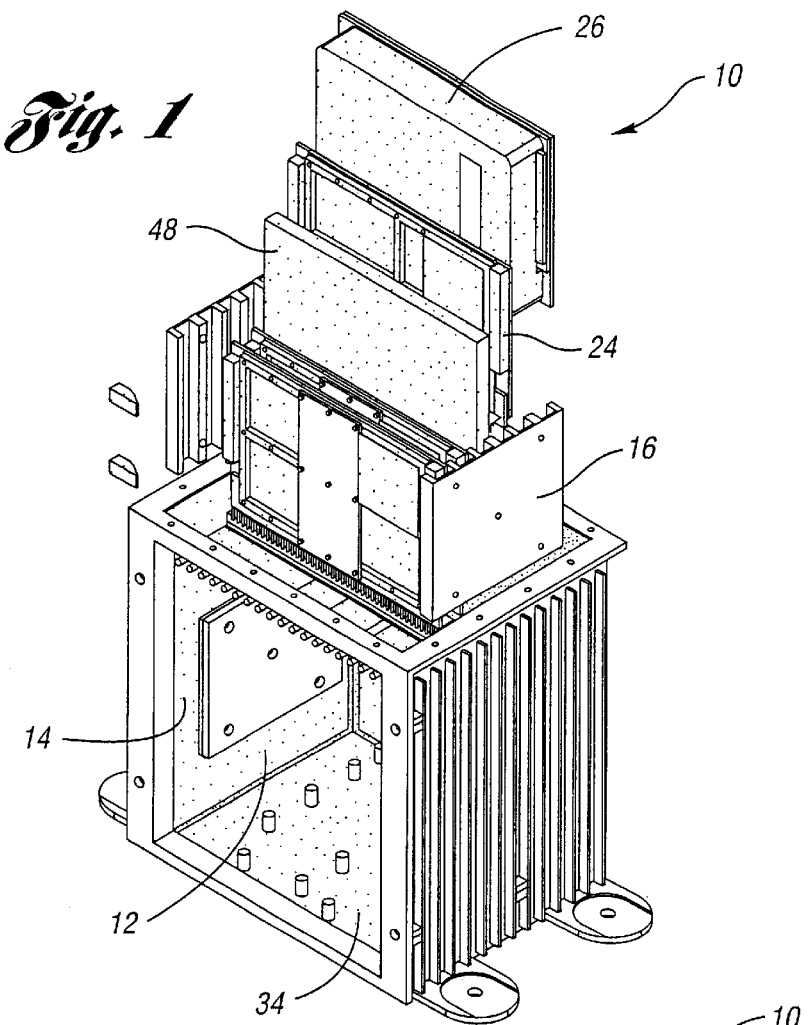
FIG. 1 is an exploded view of a modular spray cooling system according to the present invention.
Figure 3:
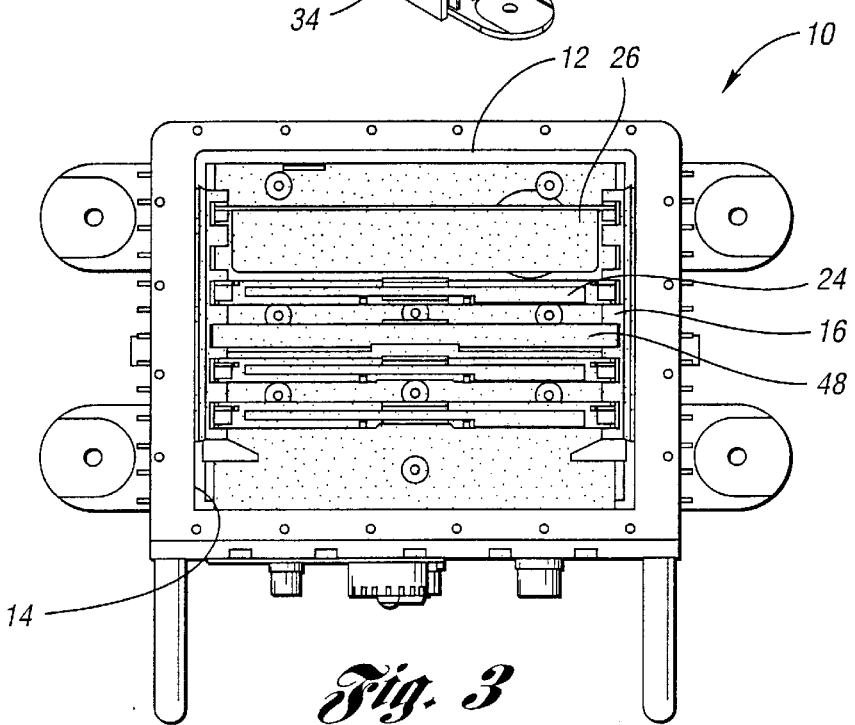
FIG. 3 is a top plan view thereof, with a top plate removed.

The invention relates to a system and method for cooling electronic components. Turning first to FIGS. 1–3 taken together, the system 10 is modular, and thus retrofittable, as suggested by FIG. 1, in that individual members of the modular spray cooling system 10 may be readily removed, inserted, or replaced. The system 10 is a state-changing cooling system in which an evaporative fluid exists in a liquid state, a finely dispersed droplet state, and in a vapor state.

With particular reference to FIGS. 1–2, it can be seen that the system 10 includes a self-contained, sealed enclosure 12 that has an inside wall 14. Attached to the inside wall 14 are plates 16 that define various slots 18. Optionally, several of the plates 16 define coolant passages that duct the evaporative coolant.

The electronic components to be cooled are contained within one or more sealed circuit card assemblies 24. Each assembly is detachably accommodated by one or more slots.

Also within the sealed enclosure 12 is a spray cooling module 26. This module includes a housing 28 within which a pump 30 and a controller 32 are accommodated. Since the pump 30 is located within the housing 28 of the spray cooling module 26, no external plumbing or fluid passages are required outside the modular spray cooling system 10. Preferably, the pump 30 is a self-priming gear pump. In a preferred embodiment, the spray cooling module 26 includes a filter.

Continuing with primary reference to FIG. 1, in a vertical orientation, the condensed cooling fluid collects in a reservoir 34 which preferably is formed at the lowest point of the sealed enclosure. Coolant passages (e.g. a flexible tube), such as those depicted by the reference numeral 20, channel the coolant to one or more ports which serve as fluid inlets to the pump 30 that is housed within the spray cooling module 26.

Figure 5:
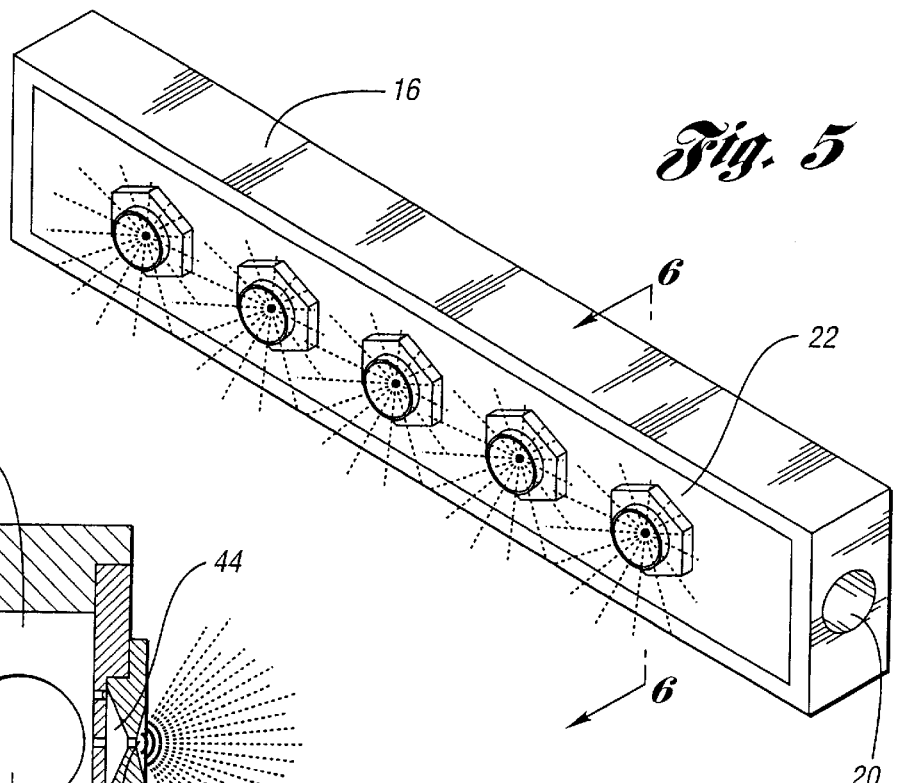
FIG. 5 illustrates an array of nozzles that are provided, for example, along the sides of the plates within the sealed housing.
Figure 6:
FIG. 6 is a cross-sectional view of a nozzle taken along the line 6—6 of FIG. 5.

FIGS. 4–6 illustrate details of the nozzles 22 through which the evaporative coolant is distributed. Also depicted in FIG. 5 is a coolant flow passage 20 which is defined within one of the plates 16. In one embodiment, the plates 16 may be hollow, so that their interstices may define plenum or manifold 46 that contains the evaporative coolant and thus is in common communication with the nozzles 22.

For a constant liquid flow rate, the manner in which the droplets cover the components to be cooled can have a significant impact on heat transfer. Such spray parameters include drop diameter, drop velocity, and the pattern that with which the droplets impact the electronic device. Increasing the heat transfer rate per volume of fluid will result in less fluid required for the system, and decrease the pump and filter sizes. This in turn leads to less space requirements.

Varying the nozzle size 42 and shape, and the swirl chamber 44 can alter the spray pattern achieved. Also, the nozzles 22 can be inserted and removed, and be tailored for the specific requirements of the position of the nozzle in relation to the electronic component to be cooled. If the spacing between the nozzle and the electronic component to be cooled is especially limited, it may desirable for the nozzle to include means for distributing the evaporative coolant substantially parallel to the plates 16. Such means may, for example, include a suitable selection of nozzle size, the geometry of the swirl chamber 44, and one or more impediments to perpendicular flow, such as a baffle. Alternatively, if it is desired that the coolant escape from the nozzle 22 substantially perpendicularly to the face of the plate 16, this can be accomplished by using a nozzle that lacks impediments to perpendicular flow, and by suitable selection of geometry of the swirl chamber 44. Thus, it will be appreciated that the nozzle plug portion of the system can be varied to provide many different spray patterns, angles of impact, droplet size, and droplet velocity. With the ability to easily change nozzle orifice, the spray manifold can be readily adjusted so that optimal spray parameters can be obtained.

If desired, a spray manifold card 48 may be detachably mountable within one or more of the slots 18. In this configuration, the circuit card assembly containing components to be cooled may effectively be sandwiched between the spray cooling module 26 and the spray manifold card 48. A number of nozzles 22 may also be located on the spray manifold card so that the spray can effectively cool the adjacent components. Additional cooling can also be achieved with the use of individual nozzles 17 (FIG. 2) that are remotely located within the enclosure.

In operation, the coolant is evaporated at least partially upon contact with the circuit card assembly 24 that contains the electronic components to be cooled. Thereafter, the vapor is condensed upon contact with an inside wall 14 of the sealed enclosure 12 or with one or more of the plates 16. The condensate gathers in the reservoir 34 and is communicated by a coolant passage to the pump before recirculation for reuse within the sealed enclosure. Thus, least some of the coolant condenses upon an interior wall of the housing following evaporation. This phase change is typically accompanied by a rise in temperature at the wall of the housing. To extract heat from the housing, a finned surface is provided upon an external surface of the housing. This finned surface allows heat to be transferred by convection therefrom. The temperature of the housing is thereby maintained at a temperature lower than the boiling point of the coolant.

Figure 7:
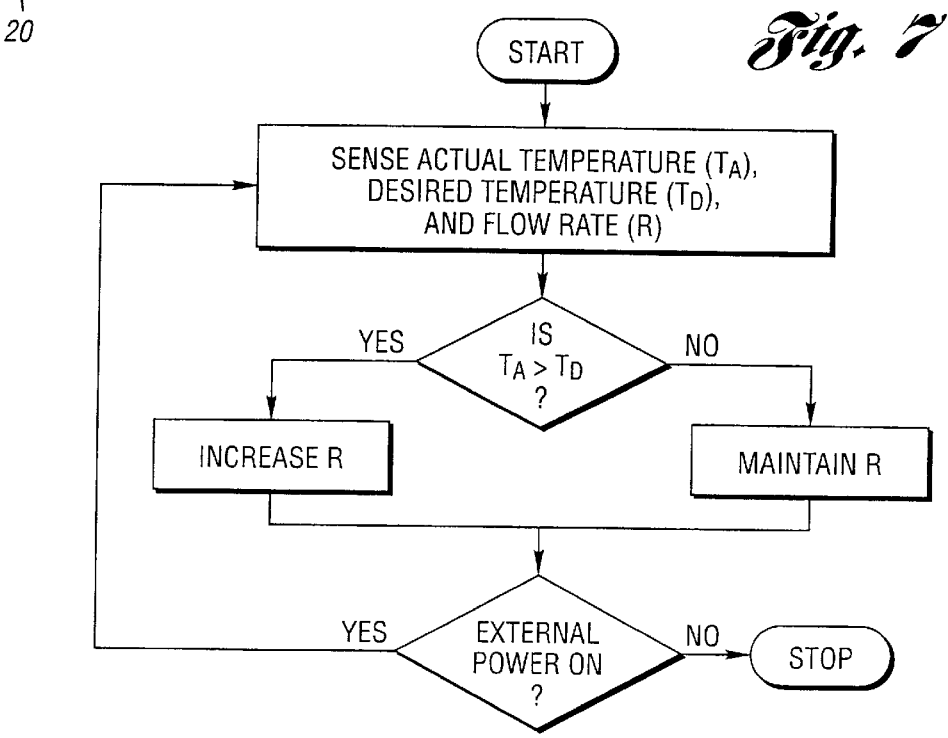
FIG. 7 is a logic flow diagram illustrating a series of processes and decisions made by a controller within the spray cooling module.

FIG. 7 illustrates a simplified logic flow associated with the controller 32 that is contained within the spray cooling module 26. The controller senses a signal which is representative of the actual temperature within the housing ($T_A$). The controller also stores a value representative of the desired temperature ($T_D$) and processes a signal that represents the average flow rate (R) of evaporative coolant in a previous time interval. Implicit within this disclosure is the presence of means (not shown) for sensing actual temperature, recording desired temperature, and for sensing flow rate.

Next, a decision module within the controller compares $T_A$ with $T_D$. If the former exceeds the latter, a signal is generated which effectively increases the flow rate by augmenting the output of the pump. If the condition is not met, then the flow rate is maintained until the external power which energizes the controller is turned off.

In practicing a method for cooling electronic components using the disclosed system, the first step is to provide a spray cooling module within a sealed enclosure having an inside wall. A plurality of plates is located, each plate defining a slot. The plates are attached to the inside wall. At least some of the plates have a coolant passage. The sealed enclosure is then primed with an evaporative coolant that may recirculate within the sealed enclosure through the coolant passages.

Next, circuit card assemblies are detachably placed within the slots. Each sealed circuit card assembly contains electronic components to be cooled by the evaporative coolant. Finally, power is delivered to a pump in the spray cooling module. The spray cooling module atomizes the liquid coolant through nozzles so that liquid droplets of the coolant are delivered to the electronic component. Cooling of the component occurs through the extraction of heat associated with the latent heat of vaporization of the coolant.

Preferably, the evaporative coolant is a dielectric fluid with a relatively high breakdown voltage, i.e. up to about twice the voltage across the bus bars. As is known, a dielectric is a substance with very low electrical conductivity, i.e., is an insulator. Liquid dielectrics include hydrocarbon oils, askarel, and silicone oils. As used herein, the term "breakdown voltage" refers to the maximum voltage that the dielectric can withstand without breakdown. Beyond that voltage, considerable current passes as an arc, usually with more or less decomposition of the fluid along the path of the current.

Preferably, the evaporative fluid of the subject invention is a thermally stable liquid, such as a perfluorocarbon. One example is the Fluorinert™ electronic liquid FC-77 that is available from the 3M Company of Minneapolis, Minn. An alternative dielectric is sold under the name Flutec™ which is manufactured by F2 Chemicals Limited of Lancashire, England. The inertness of such fluids permits their use as a direct contact, single and multiple phase coolant in the electronic environment. Their high dielectric strength and low electrical conductivity render them suitable for applications in high voltage transformers and power electronics. Ideally, such fluids have a low global warming potential and zero ozone-depletion potential.

Although several dielectric fluids are suitable for use as the evaporative coolant, satisfactory results have been obtained with the product sold by 3M company of Minneapolis, Minn. under the trademark Fluorinert™. Using Fluorinert™, heat fluxes of 20 W/cm$^2$ are possible with traditional pool boiling. Other published research has suggested that heat fluxes from 25 to 160 W/cm$^2$ can be obtained. This large range of observed heat flux is in part attributable to the drop patterns at impact. To obtain high heat fluxes for a given flow rate of coolant, the spray should sustain a thin film of liquid on the surface of the device to be cooled. If the liquid film becomes too thick, vapor bubbles can be supported within the liquid film, with a consequent diminution in the advantages of spray cooling. If the film becomes too thin, localize dry out can occur. This in turn, leads to overheating. Droplet diameters in the range of 200 to 500 microns are more effective than smaller diameters. Drops with high velocities have been shown to breakup upon impact. In contrast, drops with a velocity that is too slow do not have enough momentum to penetrate the vapor generated from the heat of the components and effectively whet the surface.

If additional spray is needed to cool specific components or an especially hot card, such as a power supply, individual nozzles and spray plates can be located as needed and space permits.

The modular spray cooling system described herein can be used to retrofit existing sealed circuit card enclosures with a self-contained system that provides a wider margin in thermal design. With increased thermal capacity, faster processors can be used.

In the environment under consideration, the evaporative fluid is dispensed in liquid droplets that impact upon the electronic components. Ideally, the temperature of the liquid droplets prior to impact is just below the fluid's boiling point. In this manner, at least a portion of the incident evaporative fluid becomes vaporized, with a desired efficiency of at least 15–20%. As defined in this disclosure, "efficiency" is defined as the ratio of the actual heat transferred to the theoretical maximum heat transferred. The theoretical maximum heat transfer is the sensible and latent heat associated with 100% vaporization of the liquid impacting the surface.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A modular spray cooling system for cooling electronic components, the system comprising:
   a sealed enclosure having an inside wall, the wall having slots located thereupon;
   one or more circuit card assemblies containing the electronic components to be cooled by a dielectric evaporative coolant, each assembly being detachably accommodated by one or more of the slots; and
   a spray cooling module that is also detachably accommodated by one or more of the slots, the spray cooling module directing the evaporative coolant toward the one or more circuit card assemblies so that they are cooled by evaporation of the coolant, the spray cooling module including:
   a housing;
   a pump within the housing;
   a controller; and
   a filter.

2. The modular spray cooling system of claim 1, further including:
   a reservoir for collecting cooling fluid condensed from the one or more circuit card assemblies.

3. The modular spray cooling system of claim 1, further including a plurality of plates attached to the inside wall of the sealed enclosure, the plates defining the slots, wherein one or more of the plurality of plates include one or more nozzles through which the evaporative spray coolant is distributed.

4. The modular spray cooling system of claim 1, further including a spray manifold card, at least one of the circuit card assemblies being interposed between the spray manifold card and the spray cooling module.

5. The modular spray cooling system of claim 1, wherein the pump comprises a self-priming gear pump.

6. The modular spray cooling system of claim 3, wherein the evaporative coolant is evaporated at least partially upon contact with the electronic components, condensed upon contact with an inside wall of the sealed enclosure or with one of the plurality of plates, and recirculated by the pump in the spray cooling module for reuse in the sealed enclosure.

7. The modular spray cooling system of claim 1, also including a reservoir that collects condensed coolant.

8. The modular spray cooling system of claim 7, also including one or more fluid passages that enable fluid communication between the reservoir and the pump.

9. The modular spray cooling system of claim 3, wherein the one or more nozzles include means for distributing the evaporative spray coolant substantially perpendicularly from the plate.

10. The modular spray cooling system of claim 4, wherein the one or more nozzles include means for distributing the evaporative spray coolant substantially parallel to the plate.

* * * * *